United States Patent [19]

Imajo

[11] Patent Number: 4,989,146
[45] Date of Patent: Jan. 29, 1991

[54] AUTOMOTIVE TROUBLE DIAGNOSING SYSTEM

[75] Inventor: Minori Imajo, Yokohama, Japan

[73] Assignee: Nissan Motor Company, Ltd., Japan

[21] Appl. No.: 783,235

[22] Filed: Oct. 20, 1985

[30] Foreign Application Priority Data

Oct. 8, 1984 [JP] Japan .................................. 59-209699

[51] Int. Cl.$^5$ ...................... G06F 15/74; G01M 15/00
[52] U.S. Cl. .......................... 364/424.04; 364/551.01; 340/635
[58] Field of Search ................ 364/550, 424.04, 424.1, 364/431.01, 551.01; 340/52 R, 52 F, 52 D, 531, 635

[56] References Cited

U.S. PATENT DOCUMENTS

| | | | |
|---|---|---|---|
| 4,404,639 | 9/1983 | McGuire et al. | 364/551 |
| 4,490,798 | 12/1984 | Franks et al. | 364/550 |
| 4,517,468 | 5/1985 | Remper et al. | 364/551 |
| 4,531,189 | 7/1985 | Mosier et al. | 364/550 |
| 4,561,057 | 12/1985 | Haley, Jr. et al. | 364/550 |
| 4,593,357 | 6/1986 | Van Ostrand et al. | 364/551 |

OTHER PUBLICATIONS

Japanese Technical Magazine "Jidosha Gijutsu (Automotive Engineering)" (vol. 37, No. 10, 1983, pp. 1098-1104).

*Primary Examiner*—Felix D. Gruber
*Assistant Examiner*—Brian M. Mattson
*Attorney, Agent, or Firm*—Lowe, Price, LeBlanc, Becker & Shur

[57] ABSTRACT

An automotive vehicle is equipped with an on-board microcomputer having a function of pre-diagnosing and indicating a possibility of arising of an automotive trouble in response to electrical informations relatable to the trouble which informations are stored in a memory device. Additionally, an acoustical coupler is mounted on the vehicle and electrically connected to the memory device to convert the electrical informations to acoustic signals. The thus converted acoustical signals are to be transmitted via a telephone line to a computer for automotive trouble diagnosis purpose which computer is located remote from the vehicle, for example, in the head office of a service firm, thereby making it possible to achieve automotive trouble diagnosis without carrying the memory device to a service factory.

16 Claims, 9 Drawing Sheets

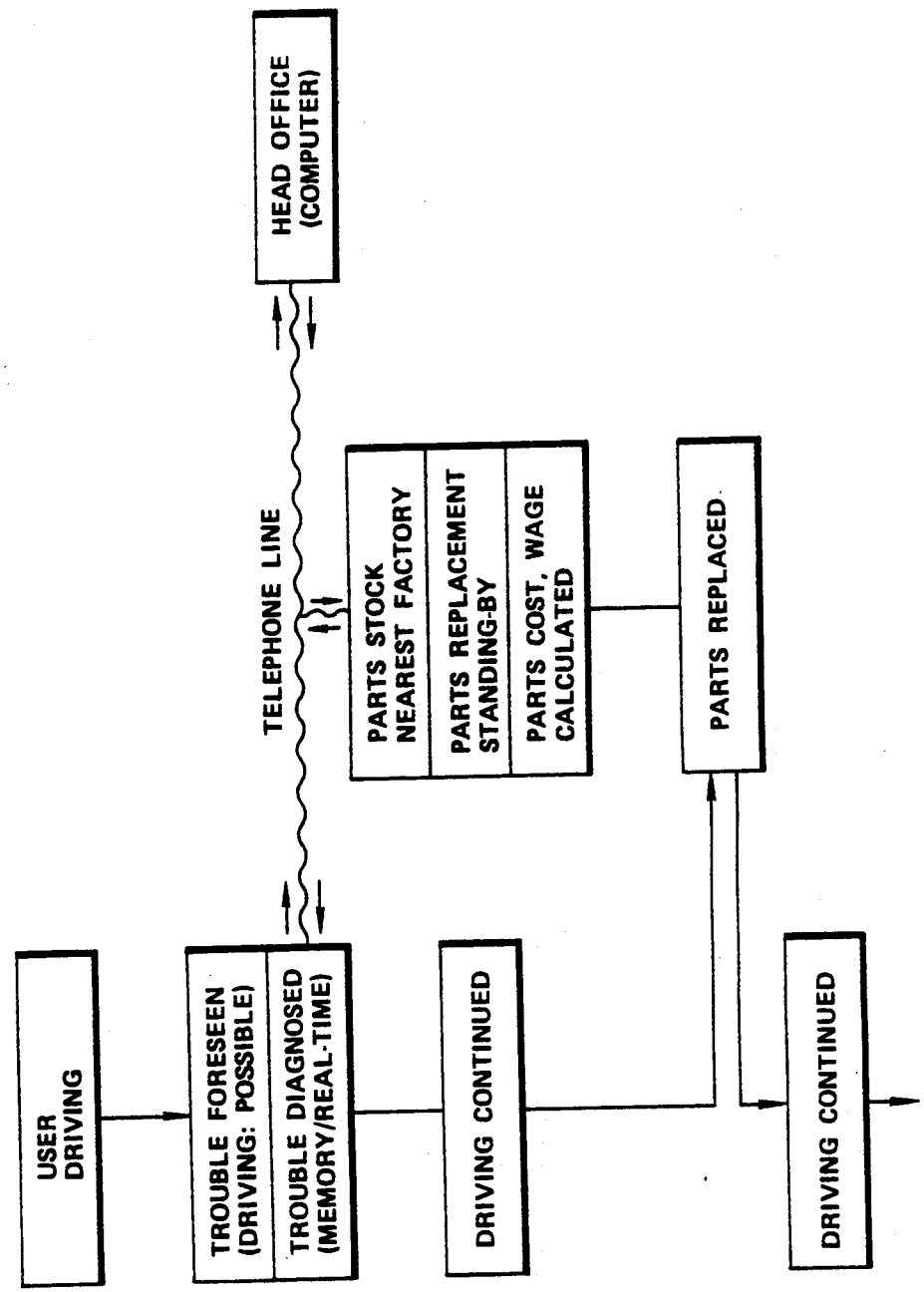

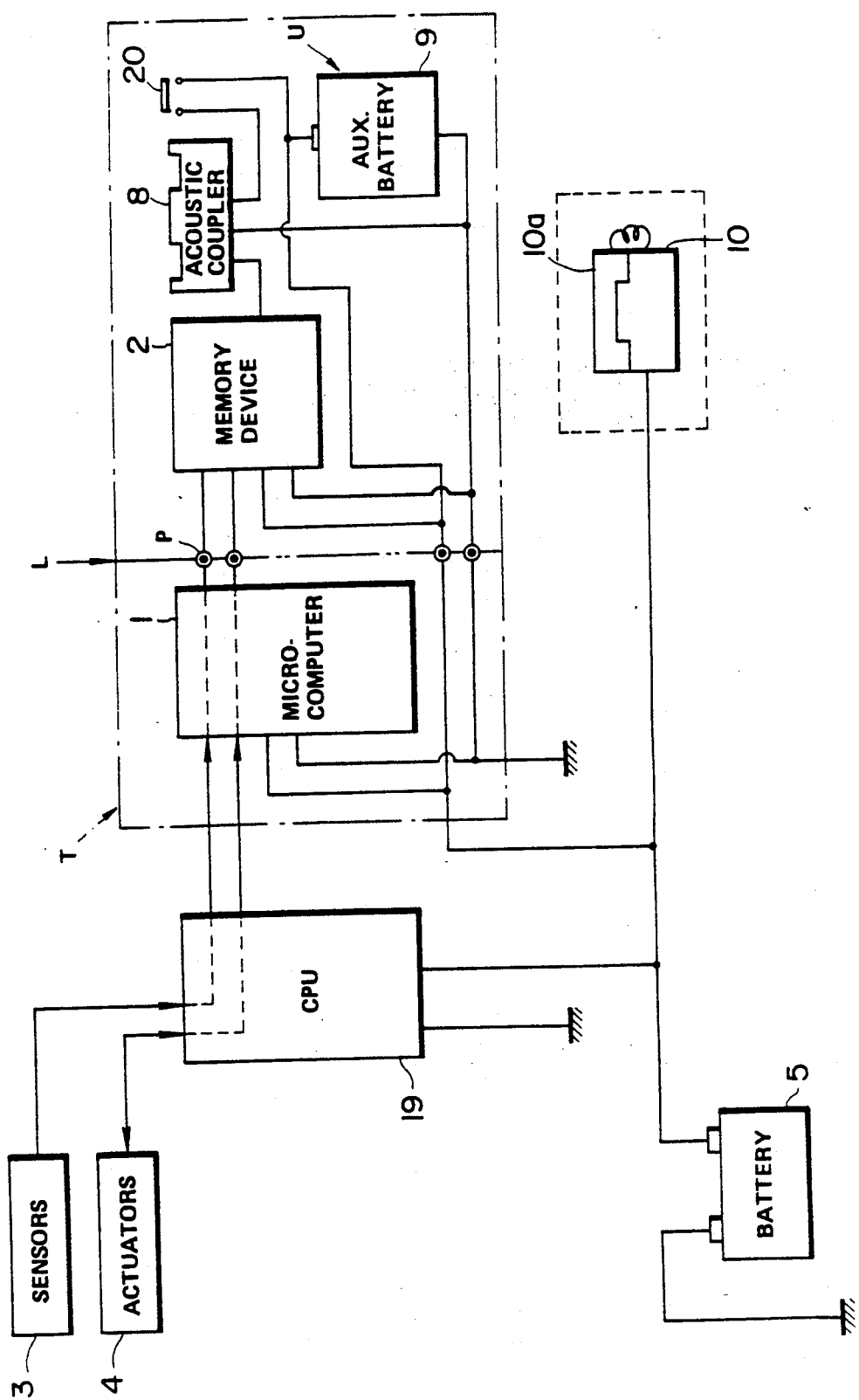

AUTOMOTIVE TROUBLE DIAGNOSING SYSTEM

BACKGROUND OF THE INVENTION

1. Field of the Invention

The present invention relates generally to a system for diagnosing a problem of an automotive vehicle, and more particularly to such a system consisting of an automotive trouble pre-diagnosing device mounted on the automotive vehicle which device warns or notices occurrence of the trouble to a driver.

2. Description of the Prior Art

Recently, technical developments in the field of automotive vehicles have been proposed and promoted to more effectively achieve a functional inspection and problem diagnosis of the automotive vehicle, in which for example a self-diagnosing device consisting of an on-board microcomputer is mounted on an automotive vehicle and a diagnosing device consisting of a computer is provided to a service factory.

However, with the thus developed automotive trouble diagnosing techniques, it is usual that at least a memory device of the on-board microcomputer is carried to the service factory and then is connected to the computer for the automotive trouble diagnosis purpose thereby to achieve the diagnosis of the automotive vehicle. This requires a longer time and a troublesome labour for repairing the automotive vehicle.

SUMMARY OF THE INVENTION

According to an automotive diagnosing system of the present invention, an automotive vehicle is equipped with a device for producing electric signals relatable to a trouble of the automotive vehicle. A memory device is mounted on the vehicle to memorize the electric signals from the signals producing device. A device is mounted on the vehicle to pre-diagnose and indicate a possibility of occurrence of the trouble in response to the electric signals memorized in the memory device. Additionally, an acoustical coupler is mounted on the vehicle and is electrically connected to the pre-diagnosing and indicating device in order to convert the electric signals to acoustic signals. The thus converted acoustic signals are to be transmitted via a telephone line to a computer located remote from the vehicle to diagnose the trouble of the vehicle.

Accordingly, when a notice or warning of occurrence; of an automotive trouble is made, the memorized content of the memory device can be transmitted via the telephone line to the trouble diagnosis computer located, for example, in a service firm head office or a service factory by setting a transmitter and receiver of an automotive telephone or of a public telephone on the acoustical coupler. Then, the trouble diagnosis computer immediately diagnoses the trouble of the automotive vehicle. Thus, automotive trouble diagnosis can be achieved without carrying the memory device mounted on the vehicle to the service factory, thereby reducing the time and labour for automotive repairing.

BRIEF DESCRIPTION OF THE DRAWINGS

The features and advantages of the automotive trouble diagnosing system of the present invention will be more clearly appreciated from the following description taken in conjunction with the accompanying drawings in which like reference numerals designate corresponding parts and elements, and in which:

FIG. 4 is a flow chart of the procedure of repairing in accordance with the system of FIG. 3;

FIG. 5 is a circuit diagram of an on-board trouble pre-diagnosing device forming part of the system of FIG. 3;

DETAILED DESCRIPTION OF THE INVENTION

Figure 1:
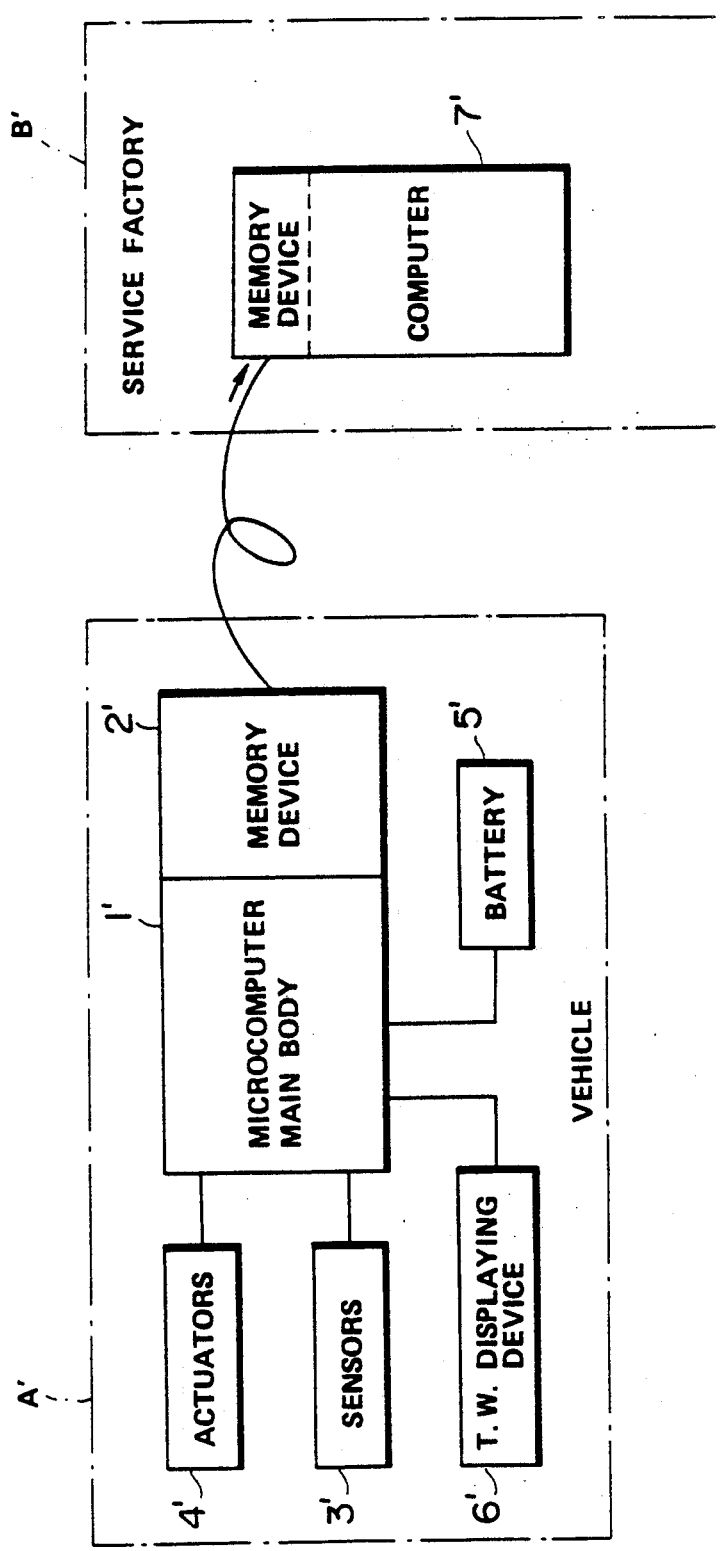
FIG. 1 is a block diagram of a conventional automotive trouble diagnosing system.
Figure 2:
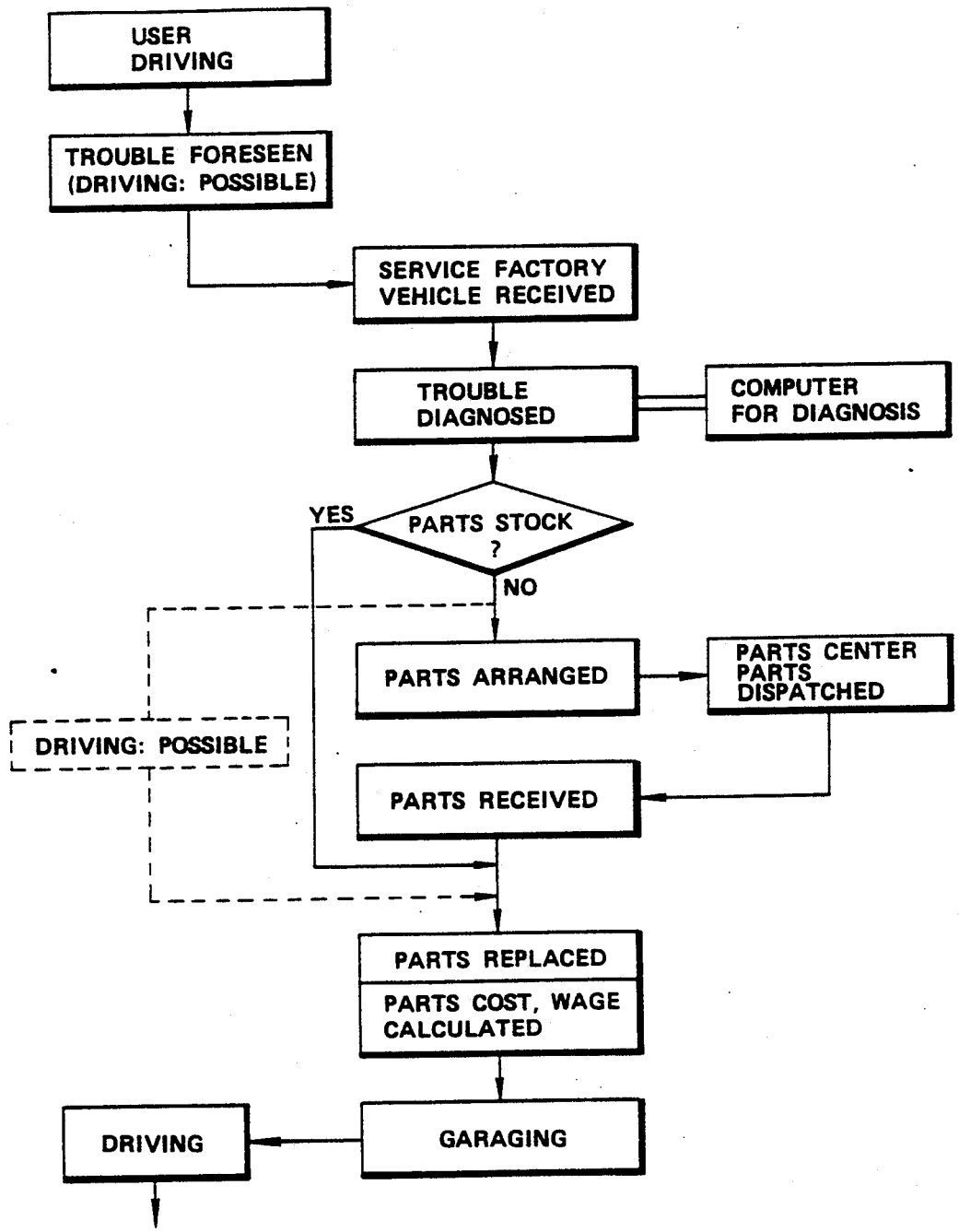
FIG. 2 is a flow chart showing the procedure of repairing in accordance with the system of FIG. 1.

To facilitate understanding the present invention, a brief reference will be made to a conventional automotive trouble diagnosing system, depicted in FIGS. 1 and 2. Referring to FIG. 1, an automotive vehicle A' is equipped with a trouble pre-diagnosing device consisting of a microcomputer main body 1' and a memory device 2'. A variety of sensors 3' and a variety of actuators 4' are electrically connected to the microcomputer main body 1' so that signals from them are input to the microcomputer main body to be memorized in the memory device 2'. The microcomputer main body 1' is operated by electric power from an automotive battery 5' and arranged to diagnose automotive troubles in response to the memorized content of the memory device 2'.

When the actuator or a certain part relating to the sensor is being or has been damaged, occurrence of an automotive trouble is foreseen or warned by a trouble warning displaying device 6'. Thus, a driver knows the occurrence of the trouble by the display of the trouble warning displaying device 6' and consequently drives the vehicle A' to a service factory B'.

In the service factory B', a service man or mechanic detaches only the memory section 2' from the microcomputer main body 1' and then connects it with a computer 7' by means of a connector cable (no numeral). The computer 7' is located in the service factory B' and so arranged as to specifically diagnose the trouble of the automotive vehicle A' upon reading the memorized content of the memory section 2' into a memory section of the computer 7'. Thus, repairing of the automotive vehicle will be made in accordance with the result of such diagnosis.

However, with such a conventional automotive trouble diagnosing system, it has been required to carry the vehicle or at least the memory section 2' of the microcomputer (as an on-board trouble pre-diagnosing device) into the service factory B' to be connected with the computer 7' in order to diagnose the trouble of the automotive vehicle A'. In this regard, the procedure of trouble diagnosing and repairing has been scheduled as shown in FIG. 2.

Accordingly, if there is no stock of replacement parts which have become necessary as a result of the trouble diagnosing, such parts are arranged to be supplied from a parts center or the like while the vehicle A' is kept in the service factory. In case the vehicle can be driven, a user or the driver continues to drive it as it is. After the necessary parts have been obtained by the service factory, the vehicle kept in the service factory or again driven into the service factory is repaired to replace a troubled part with a new one. As a result, such a trouble diagnosis and vehicle repairing has become troublesome while requiring a long repairing time.

Figure 3:
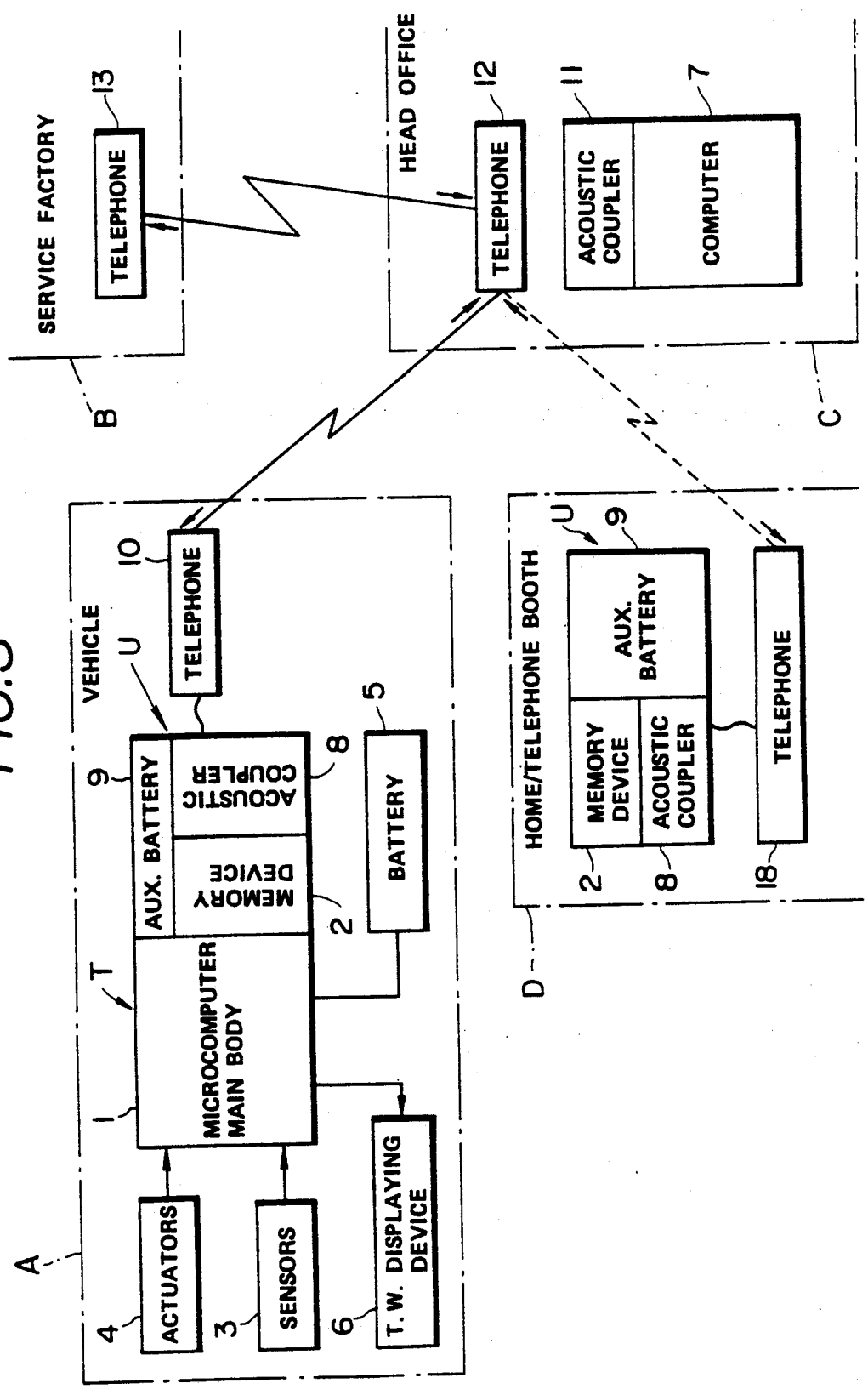
FIG. 3 is a block diagram of an automotive trouble diagnosing system according to the present invention.

In view of the above description of the conventional vehicle trouble diagnosing system, reference is now made to FIGS. 3 to 9, and more specifically to FIG. 3, wherein a preferred embodiment of an automotive trouble diagnosing system of the present invention is illustrated. The automotive trouble diagnosing system is composed of an automotive trouble pre-diagnosing device T including a microcomputer main body 1 mounted on an automotive vehicle A. The microcomputer main body 1 is so arranged as to be supplied with information (in the form of electric signals) from a variety of sensors 3 for sensing various vehicle operating parameters and from a variety of actuators 4 in connection with the operations of the vehicle. The sensors 3 include, for example, ones sensing engine speed, engine coolant temperature, engine coolant amount, exhaust gas temperature, engine vibration, battery voltage, disconnection of a variety of lamps, and gas amount of an air conditioner. The actuators 4 include, for example, fuel injectors, spark plugs, a variety of valves, pumps, electric motors, and an alternator. In addition, the microcomputer main body 1 may be supplied with data of engine control parameters from a microcomputer (not shown) for controlling the engine, in which the data are also employed for the trouble diagnosis.

A trouble warning displaying device 6 is electrically connected to the microcomputer main body 1 to display warning produced as a result of the trouble diagnosis of the microcomputer main body 1. A main battery 5 is electrically connected to the microcomputer main body 1 to supply electric power to the microcomputer main body 1. A memory section or device 2 is electrically connected to the microcomputer main body 1 in order to store the data supplied to the microcomputer main body 1 from the sensors 3 and the actuators 4. An auxiliary battery 9 is electrically connected to the memory device 2 to supply electric power to the memory device 2. Additionally, an acoustical coupler 8 is electrically connected to the memory device 2 to convert the data stored as electric signals in the memory section 2 into acoustic signals. It is to be noted that the memory device 2, the auxiliary battery 9, and the acoustical coupler 8 constitute a single unit U which is detachable from the microcomputer main body 1 to be carried out of the vehicle A. The memory device 2 is normally connected to the microcomputer main body 1 as a single unit by means of a connector (not shown). An automotive telephone 10 is provided to be acoustically connectable with the acoustical coupler 8.

A service firm is provided at its head office C with a large-sized computer 7 for the purpose of diagnosing troubles in many automotive vehicles including the vehicle A. An acoustical coupler 11 is electrically connected to the computer 7 and is adapted to be acoustically connectable with a telephone 12 provided in the service firm head office C. The service firm is provided with a service factory B having a telephone 13 to make communication with the telephone 12 of the head office C.

The procedure of trouble diagnosis and repairing will be discussed hereinafter also with reference to FIG. 4.

When the driver of the automotive vehicle A foresees a trouble of the vehicle during driving (for example, during a travel) by the warning display of the trouble warning displaying device 6, he calls the telephone 12 at the head office C of the service firm so as to connect the automotive telephone 10 to the telephone 12 in case the vehicle is equipped with the automotive telephone 10. Then, a telephone transmitter and receiver of the automotive telephone 10 is set on the acoustical coupler 8, so that the memorized content or data stored as the electric signals in the memory device 2 are transmitted via a telephone line to the large-sized computer 12 in the service firm head office C. It will be understood that the memorized content corresponds to the information from the sensors 3 and the actuators 4.

Thus, the large-sized computer 7 is operated to diagnose the trouble of the vehicle A in on-line real-time in accordance with the data transmitted from the memory device 2 on the vehicle side, thereby specifying a trouble and a location at which the trouble is made while searching the nearest service factory B in the advancing direction of the user's vehicle A which factory is provided with the stock of automotive parts for replacement. Then, a telephone communication is made from the head office C to the service factory B by using telephones 12, 13, and a further telephone communication is made from the head office 12 to the user by using the telephones 12, 10 so that the user can know the nearest service factory B. In the service factory B, the service men immediately stand by for repairing and parts replacement upon completing calculation of the wages and the parts cost. During time, the user continues his driving and drives the vehicle A into the nearest service factory B in which the repairing is smoothly completed, and thereafter again returns to driving (travel).

In case the automotive telephone 10 is not equipped in the vehicle, when the driver foresees arising of automotive troubles under the display of the trouble warning displaying device 6 and/or the vehicle A is in a bad condition, the driver drives the vehicle back to his home if near the home or otherwise to a service area if during travel. Then, the detachable unit U consisting of the memory device 2, the acoustic coupler 8, and auxiliary battery 9 is detached from the microcomputer main body 1 and carried out of the vehicle A, at which time the driver calls the telephone 12 in the head office C by using a telephone 18 at his home or at a public telephone booth D. Then, a telephone transmitter and receiver (not shown) is set on the acoustic coupler 8 thereby to transmit the memorized content or data stored in the memory device 2 to the large-sized computer for trouble diagnosis located in the head office C. Thus, a trouble diagnosis is accomplished by the computer 7, wherein the driver or user is advised about repairing and as to whether an emergency measure is necessary or not while being instructed for the service factory B. Hereinafter, the same procedure as in FIG. 4 is carried out until completion of repairing.

FIG. 5 shows a circuit arrangement of the trouble pre-diagnosing device T mounted on the automotive vehicle A. The device T includes the microcomputer main body 1 which is electrically connected to the sensors 3 and to the actuators 4 through a CPU 19 for engine control. The microcomputer main body 1 is electrically connected to the memory device 2 forming part of the detachable unit U. The detachable unit U can be detached at a line indicated by a character L from the microcomputer main body 1, so that the memory device 2 is disconnected at contact points P from the microcomputer main body 1. As shown, a data transmitting switch 20 is provided to allow the data or the memorized content stored in the memory device 2 to be transmitted upon being switched ON.

Figure 6A:
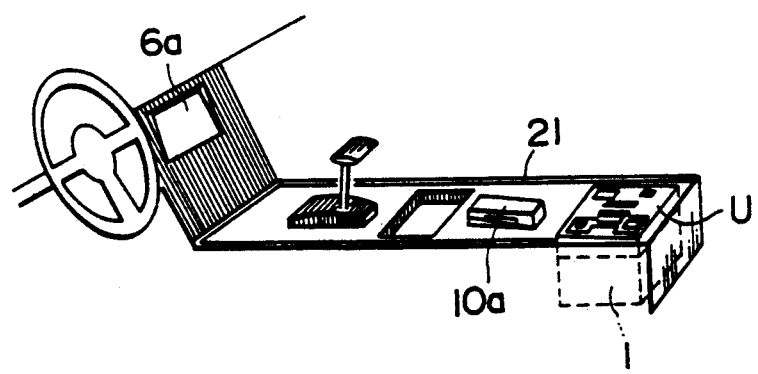
FIG. 6A is a fragmentary perspective view of the on-board trouble pre-diagnosing device of FIG. 5 mounted in a passenger compartment of the vehicle.
Figure 6B:
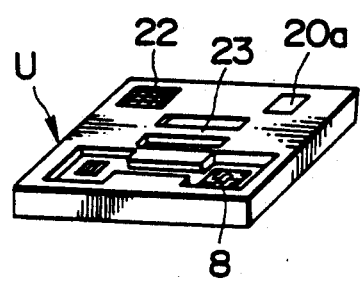
FIG. 6B is an enlarged perspective view of a detachable unit of the trouble pre-diagnosing device of FIG. 6.
Figure 6C:
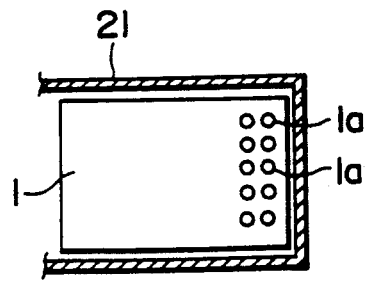
FIG. 6C is a plan view of a microcomputer main body of the trouble pre-diagnosing device of FIG. 6.

FIGS. 6A, 6B and 6C show an actual arrangement of the trouble pre-diagnosing device T within a passenger compartment of the automotive vehicle A. Located near a steering wheel (no numeral) is a cathode-ray tube 6a forming part of the trouble warning displaying device 6 on which tube the result and the like of trouble pre-diagnosis are displayed. A transmitter and receiver 10a of the automotive telephone 10 is located on a console box 21 in which the microcomputer main body 1 is disposed. The detachable unit U detachably fits on the microcomputer main body 1. The detachable unit U is provided with the acoustical coupler 8 on which the telephone transmitter and receiver 10a can be set, and with a device 22 serving as a microphone and a speaker after the telephone transmitter and receiver 10a is located on the acoustical coupler 8. A carrying handle 23 is provided to facilitate carrying the detachable unit U out of the vehicle A. A button 20a of the data transmitting switch is adapted to be pushed after making such a communication as to permit transmitting the data. The microcomputer main body 1 is provided with a plurality of terminals 1a with which the terminals (not shown) of the detachable unit U are brought into contact upon the detachable unit U being set on the microcomputer main body 1, the terminals on the both sides constituting the contact points P (in FIG. 5) through which electrical signal communication between the microcomputer main body 1 and the detachable unit U is made. The terminals 1a include a terminal through which charging of the auxiliary battery 9 is made.

Figure 7:
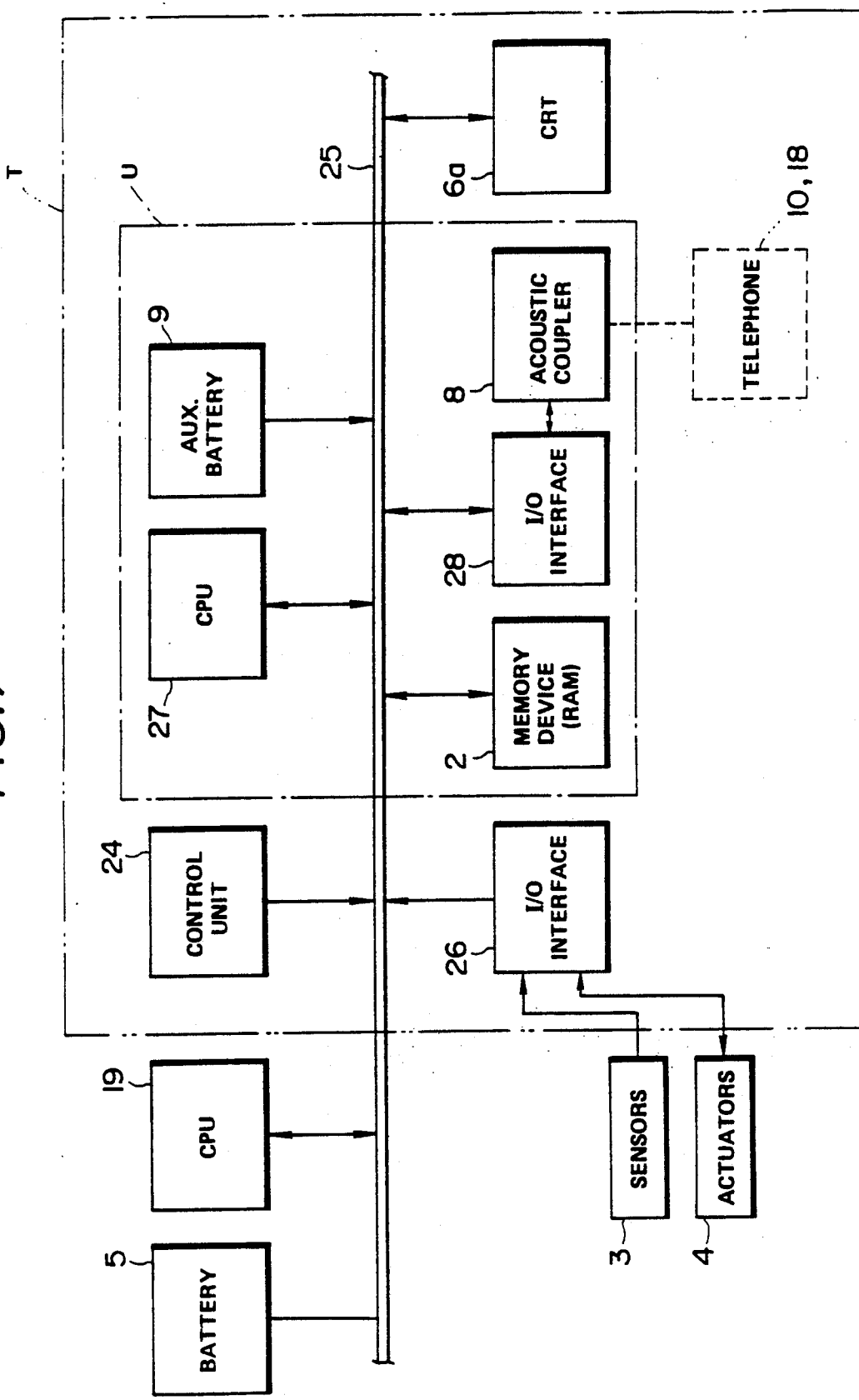
FIG. 7 is a block diagram of the on-board trouble pre-diagnosing device of FIG. 5.

FIG. 7 shows a control system of the trouble pre-diagnosing device T in which a control unit 24 for controlling the initiation, termination and maintenance of storing the data from the sensors 3 and the actuators 4 is connected to a bus line 25. The data from the sensors 3 and the actuators 4 are fed through an input and output interface 26 to the bus line 25. The memory (RAM) 2 is controlled by a CPU 27 forming part of the detachable unit U. The memorized content or data stored in the memory 2 is taken out through an input and output interface 28 to the acoustical coupler 8 connectable with the telephone 10, 18.

Figure 8:
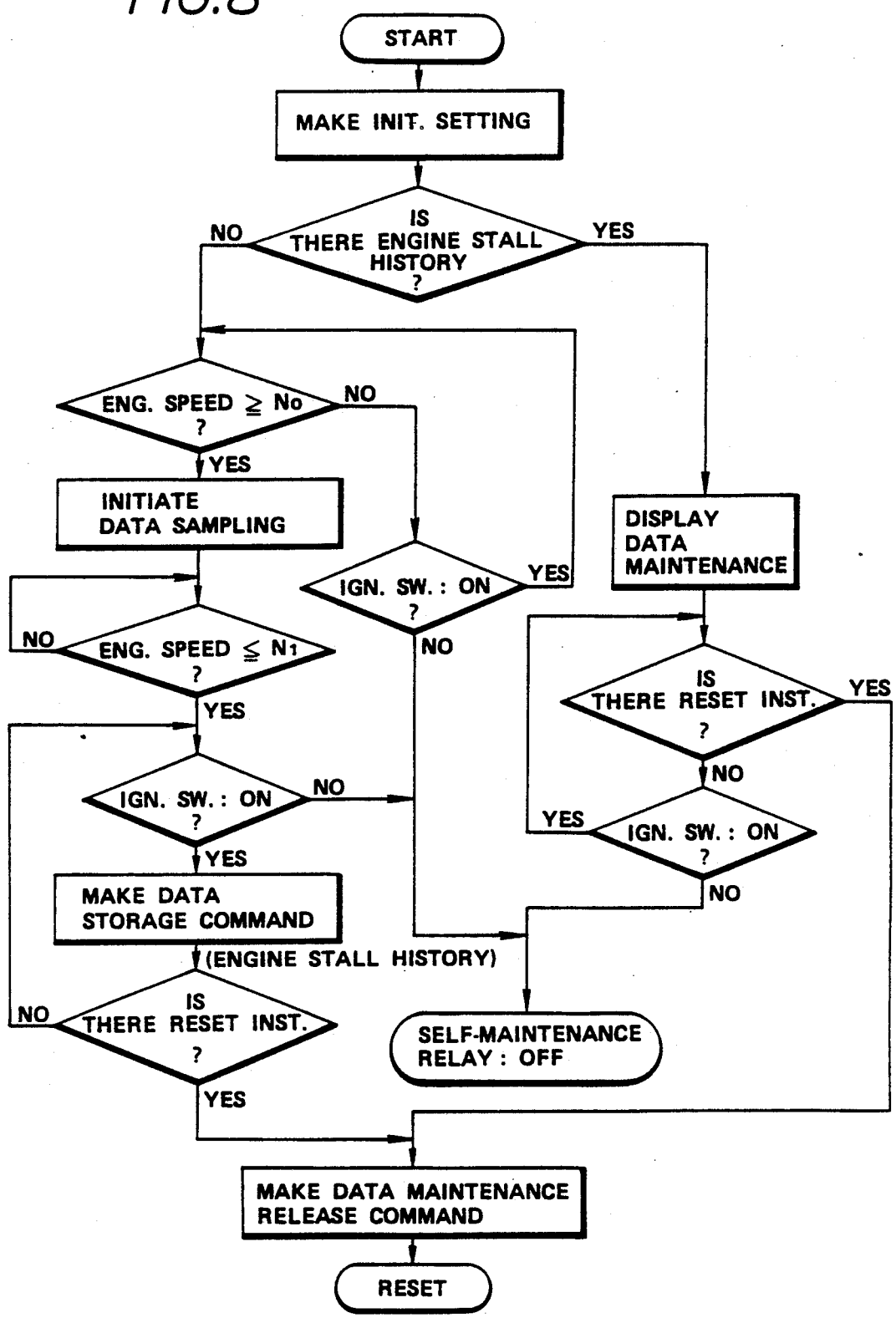
FIG. 8 is a flow chart of the operational procedure of a control unit used in the device of FIG. 7.

The operation procedure of the control unit 24 will be illustrated with reference to FIG. 8.

After an initial setting is made upon starting, a decision is made as to whether there is an engine stall history. If there is no engine stall history, a decision is made as to whether engine speed is $N_0$ or higher. In the case of being $N_0$ or higher, sampling of the data is initiated. Thereafter, a decision is made as to whether engine speed is $N_1$ or lower. In case of being $N_1$ or lower, a decision is made as to whether an ignition switch is switched ON or not. In the case of being switched ON, a command is made to store data (engine stall history). Thereafter, a decision is made as to whether there is instructions for resetting. If there is the instructions, a command is made to release the maintenance of the data to be reset.

If there is the engine stall history, a display for the data maintenance is made. Therefore, a decision is made as to whether there is an instruction for resetting. In the case there is no instruction, a decision is made as to whether the ignition switch is switched ON or not. If the ignition switch is not switched ON, a self-maintaining relay is switched OFF. In the case there is the instruction for resetting, the command is made to release the maintenance of the data to be reset.

Figure 9:
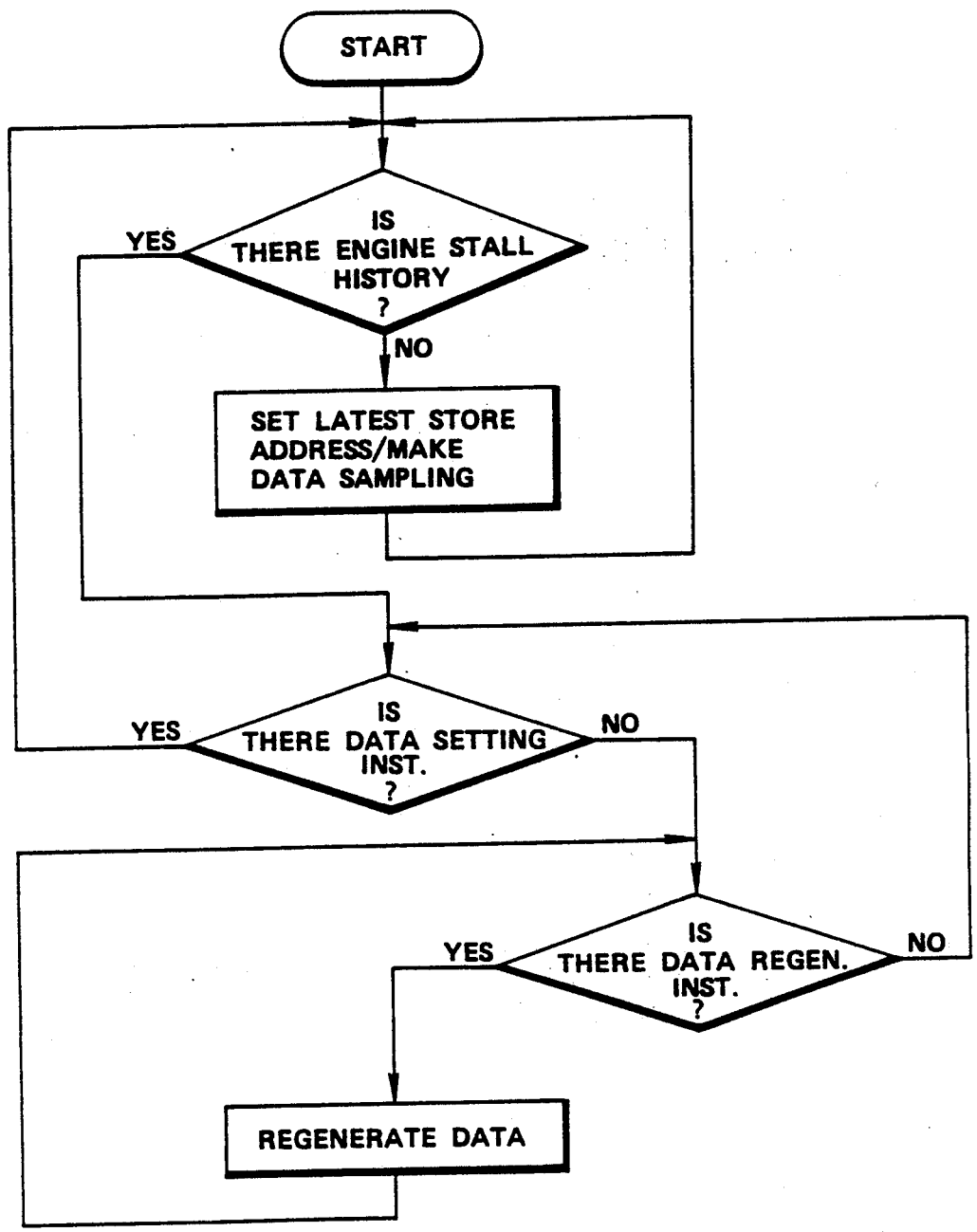
FIG. 9 is a flow chart of the operational procedure of a CPU for memory control of FIG. 7.

Next, the operation procedure of the CPU 27 in FIG. 7 will be illustrated with reference to FIG. 9.

A decision is made as to whether there is an engine stall history upon starting. If there is no such a history, the latest address for data storing is set and sampling the data is made. If there is an engine stall history, a decision is made as to whether there is an instruction for setting data. In the case where there is no such an instruction, a decision is made as to whether there is a command for data regeneration. If there is the command, the data is regenerated.

As appreciated from the above, the automotive vehicle is equipped with the memory device for storing the operational condition data of a variety of sensors and actuators, and the acoustic coupler by which the memorized content of the memory device is transmitted via the telephone line to the large-sized computer for the trouble diagnosis purpose. Therefore, in the event that the driver foresees arising of automotive trouble from the display of the trouble warning displaying device or that the vehicle is in a bad condition, the memorized content stored in the memory device is transmitted to the trouble diagnosis purpose large-sized computer installed in the head office or the like of the service firm to diagnose the automotive trouble thereby specifying a trouble arising part and necessary replacement parts in real-time by utilizing the automotive telephone or the public telephone before the vehicle is driven into the service factory.

Accordingly, the vehicle can be driven into the nearest service factory having the stock of the necessary replacement parts so that repairing is completed within a short time thereby to sharply reduce the time and labor for repairing. This will make a long distance drive comfortable.

Furthermore, it is unnecessary for the service firm to provide many large-sized computers for trouble diagnosis purpose to respective service factories, and therefore only one large-sized computer is sufficient to be installed in a head office. This will sharply reduce the cost for facility and improves the utilizing efficiency of the computer.

What is claimed is:

1. In an automotive vehicle, the improvement comprising:
   computing means onboard the vehicle, said computing means powered by an automotive battery of the vehicle, memory means connected to the computing means for storing data from sensing means in the vehicle;
   detachable unit means, including said memory means, coupling means for coupling said memory means to a remote computing means operable for remotely determining service and parts required for correction of a diagnosed problem of the vehicle, and auxiliary battery means for powering said memory means and said coupling means;

said detachable unit means including a plurality of contact points for connection to said computing means onboard the vehicle, including a contact point for charging said auxiliary battery from the automotive battery of the vehicle;

first means for producing electric signals relatable to the diagnosed problem of the automotive vehicle;

said memory means being further operable for memorizing said electrical signals;

second means for pre-diagnosing and indicating a possibility of occurrence of said problem in response to said electric signals memorized in said memory means; and said coupling means including an acoustical coupler electrically connected to said memory means to convert said electric signals to acoustic signals, said acoustic signals transmitted via a telephone line to a computer in said remote computing means and located remote from said automotive vehicle, said computer being arranged to diagnose the problem of said automotive vehicle in response to said acoustic signals.

2. An automotive trouble diagnosing system comprising:

means mounted to an automotive vehicle for producing electric signals relatable to a trouble of the automotive vehicle;

memory means mounted to the automotive vehicle for memorizing said electric signals;

means mounted to said automotive vehicle for pre-diagnosing and indicating a possibility of occurrence of the trouble in response to said electric signals memorized in said memory means;

a first acoustical coupler mounted to said automotive vehicle and electrically connected to said memory means to convert said electrical signals to acoustic signals;

a telephone line;

a second acoustical coupler acoustically connectable with said first acoustical coupler via said telephone line to convert said acoustic signals to electric signals; and a computer located remote from said automotive vehicle and electrically connected to said second acoustical coupler, said computer being arranged to diagnose the trouble of said automotive vehicle, wherein said pre-diagnosing and indicating means forms part of a microcomputer mounted in said automotive vehicle, and wherein said memory means and said first acoustical coupler constitute a single unit detachable from said microcomputer so that said memory means is capable of being electrically disconnected from said pre-diagnosing and indicating means, said detachable single unit including an auxiliary battery independent from a battery for operation of said automotive vehicle.

3. An automotive trouble diagnosing system as claimed in claim 2, wherein said telephone line includes a telephone transmitter and receiver acoustically connectable with said first acoustical coupler.

4. An automotive trouble diagnosing system as claimed in claim 3, wherein said telephone transmitter and receiver is mounted in said automotive vehicle.

5. An automotive trouble diagnosing system as claimed in claim 3, wherein said telephone transmitter and receiver is located remote from said automotive vehicle, in which said first acoustical coupler of said detachable single unit is acoustically connectable with said telephone transmitter and receiver.

6. In an automotive vehicle diagnostic system, the improvement comprising:

first means, at a service headquarters, for remotely determining service and parts required for correction of a diagnosed problem of the vehicle;

second means responsive to said first means for determining availability of said required parts;

third means responsive to said second means for remotely communicating with the vehicle to identify a location of said required parts; and fourth means in the vehicle for receiving communication from said first means and for outputting to a vehicle driver information identifying service needed for the vehicle and location for obtaining said needed service.

7. An improved automotive vehicle diagnostic system as recited in claim 6, further comprising:

fifth means in the vehicle for diagnosing a plurality of signals generated by a plurality of sensors and actuators to determine a source of a problem; and sixth means responsive to said fifth means for communicating the diagnosed problem source to said remotely located first means.

8. An improved automotive vehicle diagnostic system as recited in claim 7 wherein said sixth means includes telephone communicating means in said vehicle and modem means connected to a storage means in said vehicle, said sixth means operable for transmitting said diagnosed problem source to said first means from said vehicle.

9. An improved automotive vehicle diagnostic system as recited in claim 7, wherein said sixth means includes modem means connected to a storage means in said vehicle, said sixth means further including auxiliary power source means and seventh means for selectively detaching and connecting said sixth means to said vehicle, said modem means operable when detached from said vehicle and powered by said auxiliary power source means for detachably transmitting said diagnosed problem source from said sixth means to said first means via a telephone instrument.

10. In an automotive vehicle diagnostic system including computing means onboard the vehicle, said computing means powered by an automotive battery of the vehicle, memory means connected to the computing means for storing data from sensing means in the vehicle, the improvement comprising:

detachable unit means, including said memory means, coupling means for coupling said memory means to a remote computing means operable for remotely determining service and parts required for correction of a diagnosed problem of the vehicle, and auxiliary battery means for powering said memory means and said coupling means, said detachable unit means including a plurality of contact points for connection to said computing means onboard the vehicle, including a contact point for charging said auxiliary battery from the automotive battery of the vehicle.

11. An automotive vehicle diagnosing system as recited in claim 10 further comprising:

first means mounted to the automotive vehicle for producing electric signals relatable to the diagnosed problem of the automotive vehicle;

said memory means being further operable for memorizing said electric signals;

second means mounted to the automotive vehicle for pre-diagnosing and indicating a possibility of occurrence of said problem in response to said electric signals memorized in said memory means;

said coupling means including a first acoustical coupler mounted to said automotive vehicle and electrically connected to said memory means to convert said electrical signals to acoustic signals;

a telephone line;

a second acoustical coupler acoustically connectable with said first acoustical coupler via said telephone line to convert said acoustic signals to electric signals; and said remote computing means including a computer located remote from said automotive vehicle and electrically connected to said second acoustical coupler, said computer being arranged to diagnose the problem of said automotive vehicle.

12. An automotive trouble diagnosing system as claimed in claim 11, wherein said first means includes a plurality of sensors for sensing automotive vehicle parameters relatable to said trouble, and a plurality of actuators operable in connection with operation of an engine of said automotive vehicle.

13. An automotive trouble diagnosing system as claimed in claim 11, wherein said second means forms part of a microcomputer in said computing means on-board the automotive vehicle.

14. An improved automotive vehicle diagnostic system as recited in claim 10, wherein the remote computing means includes means for remotely determining availability of said required parts remotely from the vehicle and further means for communicating with the vehicle to identify thereto a location of said required parts.

15. An improved automotive vehicle diagnostic system as recited in claim 14 wherein said further means is operable in response to the service and parts determined by the remote computing means for computing parts and service costs and for communicating the computed costs to the vehicle.

16. An improved automotive vehicle diagnostic system as recited in claim 14 wherein said coupling means and said further means each comprise modem means for providing communication between said detachable unit means and the remote computing means via a telephone network.

* * * * *